(12) United States Patent
King et al.

(10) Patent No.: US 7,439,501 B2
(45) Date of Patent: Oct. 21, 2008

(54) DIRECT WRITE NANOLITHOGRAPHY USING HEATED TIP

(75) Inventors: William P. King, Smyrna, GA (US); Clifford L. Henderson, Douglasville, GA (US)

(73) Assignee: Georgia Tech Reasearch Corporation, Atlanta, GA (US)

( * ) Notice: Subject to any disclaimer, the term of this patent is extended or adjusted under 35 U.S.C. 154(b) by 275 days.

(21) Appl. No.: 11/468,409

(22) Filed: Aug. 30, 2006

(65) Prior Publication Data

US 2007/0114401 A1    May 24, 2007

Related U.S. Application Data

(60) Provisional application No. 60/712,622, filed on Aug. 30, 2006.

(51) Int. Cl.
    *G01N 13/16* (2006.01)
    *G01B 5/28* (2006.01)
    *G01B 7/34* (2006.01)
    *G12B 21/02* (2006.01)

(52) U.S. Cl. .............. 250/306; 250/307; 250/309; 73/105

(58) Field of Classification Search .......... 250/306, 250/307, 309; 73/105
    See application file for complete search history.

(56) References Cited

U.S. PATENT DOCUMENTS

| | | | |
|---|---|---|---|
| 7,005,378 B2 * | 2/2006 | Crocker et al. | 438/674 |
| 7,151,256 B2 * | 12/2006 | Guillorn et al. | 250/306 |
| 2003/0205657 A1 | 11/2003 | Voisin | |
| 2004/0127025 A1 | 7/2004 | Crocker, Jr. et al. | |
| 2004/0192041 A1 | 9/2004 | Jeong et al. | |
| 2005/0103993 A1 | 5/2005 | Guillorn et al. | |
| 2006/0040057 A1 * | 2/2006 | Sheehan et al. | 427/256 |
| 2006/0254345 A1 * | 11/2006 | King et al. | 73/105 |

\* cited by examiner

*Primary Examiner*—Nikita Wells
(74) *Attorney, Agent, or Firm*—Bockhop & Associates, LLC; Bryan W. Bockhop

(57) ABSTRACT

A device for sculpting a substrate includes a vertically displaceable probe having a nano-scale dimensioned probe tip. A displacement mechanism is configured to adjust a vertical displacement between the probe tip and the substrate. A heating mechanism selectively heats the probe tip to a preselected temperature that is sufficient to cause a portion of the substrate in contact with the probe tip to decompose.

23 Claims, 3 Drawing Sheets

DIRECT WRITE NANOLITHOGRAPHY USING HEATED TIP

CROSS-REFERENCE TO RELATED APPLICATION

This application claims the benefit of U.S. Provisional Patent Application Ser. No. 60/712,622, filed Aug. 30, 2006, the entirety of which is hereby incorporated herein by reference.

BACKGROUND OF THE INVENTION

1. Field of the Invention

The present invention relates to nanolithography and, more specifically, to a method for sculpting two-dimensional and three-dimensional nano-scale patterns using a heatable probe.

2. Description of the Prior Art

Small scale patterning and sculpting of surfaces to produce devices as diverse as semiconductors or biological systems is typically accomplished using one of three methods: (1) optical lithography using projection exposure tools at wavelengths ranging from 365 nm to 13 nm, (2) direct write electron beam lithography, and (3) imprint or embossing lithography.

Optical lithography produces a large volume of microscale and nano-scale devices. However, as device dimensions shrink below 100 nm in size, optical lithography becomes increasingly difficult. A major problem with optical lithography is in the fabrication of the photomasks that generate the optical patterns used in forming desired physical patterns. Photomasks are produced using direct write methods employing either laser pattern generators or electron beam exposure tools. As device dimensions shrink, photomasks become prohibitively expensive due to the low yields associated with producing such technically demanding photomasks. Methods that could be used to produce photomasks with lower costs, higher throughputs, or with improved yields could substantially benefit the lithography industry and the many industries that rely upon it.

Although electron beam lithography is a high resolution patterning technique, it is still typically used only in device prototyping and niche applications such as photomask manufacturing. Direct-write electron beam lithography is limited because it uses a serial writing style that limits throughput and also because increasing exposure times are required as feature sizes are reduced and accelerating potentials are increased. Also, due to their highly complex nature, the development and final costs of advanced electron beam patterning systems are extremely high.

Even if all of the lithography challenges were to be overcome, there would still be a need to inspect and repair low-volume, high-value application-specific integrated circuits, particularly at device sizes that cannot be accessed by optical techniques. Once fabricated, integrated circuit chips are not easily post-processed, especially given the high temperatures and harsh chemical conditions that conventional patterning systems expose the chip to. One strategy to post-processing has been complete encapsulation of the circuit elements, but this does not allow the circuit itself to be modified.

The atomic force microscope (AFM) offers significant opportunities to probe and manipulate material at the nanometer scale. The scaling of these probing and manipulating techniques to large arrays of AFM probes may become the technology that enables the practical implementation of nanotechnologies for widespread use. While there are a number of nanometer-scale manufacturing techniques that exploit the AFM, there remain several unmet needs. While sub-100 nm resolution is possible with a number of techniques, the writing speed is a significant challenge, with typical tip speeds in the range 0.1-1 nm/sec. Furthermore, AFM writing techniques offer little three-dimensionality, with most writing resulting in very thin marks or, at best, digging or building that offers little control in the z-direction.

Therefore, there is a need for a method for producing nanostructures that can meet or exceed the throughput of electron beam direct write systems.

There is also a need for a method for producing nanostructures that can achieve comparable resolution to electron beam systems at relevant throughputs.

There is also a need for a method for producing nanostructures that can be provided at lower capital tool costs.

There is also a need for a method for producing nanostructures that can provide perform in-situ metrology and repair.

There is also a need for a system for repairing and modifying, at the nanoscale, manufactured devices.

SUMMARY OF THE INVENTION

The disadvantages of the prior art are overcome by the present invention which, in one aspect, is embodied as a device for sculpting a substrate that includes a vertically displaceable probe having a nano-scale dimensioned probe tip. A displacement mechanism is configured to adjust a vertical displacement between the probe tip and the substrate. A heating mechanism selectively heats the probe tip to a preselected temperature that is sufficient to cause a portion of the substrate in contact with the probe tip to decompose.

In another aspect, the invention is embodied as a device for sculpting a substrate that includes an array of independently heatable probes. Each of the probes includes a probe tip. A heating mechanism is capable of heating each probe tip to a temperature that will cause material in the substrate adjacent to the probe tip to decompose. A translator causes the substrate and the array to move relative to each other in a lateral dimension along a preselected path.

In yet another aspect, the invention is embodied as a method of sculpting a substrate with a tip of an integrated heatable probe, in which a displacement of the tip relative to the substrate is changed so that the tip is at a preselected depth in the substrate. The tip is heated to a temperature that will cause a portion of the substrate in a region adjacent to the tip to decompose.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
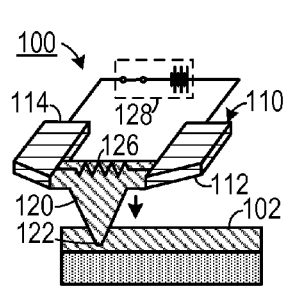
FIGS. 1A-1C are schematic diagrams showing nanolithographic sculpting using a heated probe affixed to a cantilever.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1B:
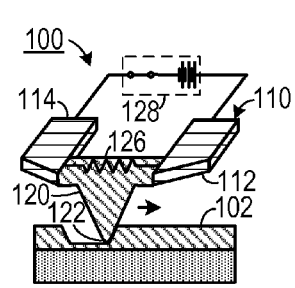
Figure 1C:
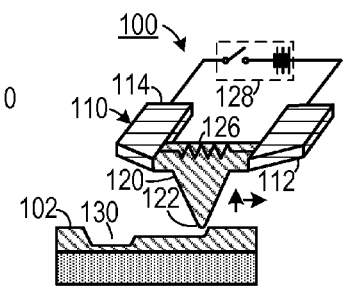

One embodiment includes a system and a method for sculpting a surface at the nano-scale. The embodiment includes a probe that can be heated to a temperature that causes material near the surface to decompose. The tip of the probe is brought close to, or in contact with, the surface so as to cause material adjacent the tip of the probe to decompose. As shown in FIGS. 1A-1C, one embodiment includes a nano-sculpting device 100 that employs a probe 120 having a probe tip 122 and a heating element 126 associated therewith. The heating element 126 may be integrated with the probe 120 or separate from the probe, but capable of controlling the temperature of the probe 120. In one embodiment, the heating element is a resistive member 126 disposed between a first conductive arm 112 and a second conductive arm 114 of a cantilever 110, such as a micro-cantilever that is used in association with an atomic force microscope. When a potential, from a controllable voltage source 128, is applied between the first conductive arm 112 and the second conductive arm 114, the resistive member heats up to a temperature that causes material at the surface of the substrate 102 to decompose, thereby creating an opening 130 in the substrate 102.

As shown in FIGS. 1B and 1C, if either the probe 120 or the substrate 102 is translated laterally while the probe tip 122 is at the decomposition temperature, the opening 130 will take the form of a channel. As shown in FIG. 1C, if the vertical displacement of the probe 120 relative to the substrate 102 is varied during lateral translation, then a multi-leveled structure may be formed.

Figure 2:
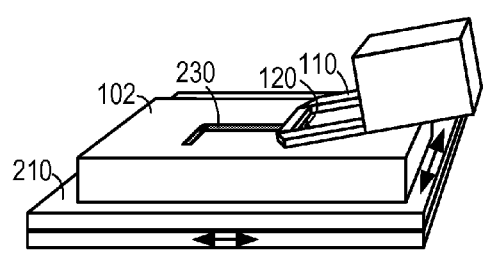
FIG. 2 is a top perspective drawing of a cantilever-mounted probe configured to remove material from an object disposed on a translation table.

As shown in FIG. 2, if a translator, such as a translation table 210 is employed with the probe 120, then a multidimensional channel 230 may be formed in the substrate 102. Multiple passes can result in the formation of three-dimensional structures.

Figure 3A:
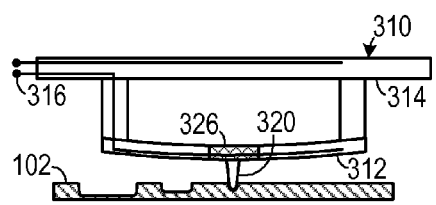
FIGS. 3A-3B are schematic diagrams showing an embodiment employing a membrane-type actuator to control displacement of a probe.
Figure 3B:
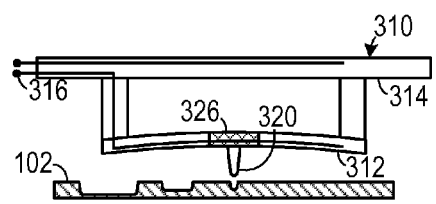

While sculpting may be done with a probe mounted on a cantilever, as discussed above, many other configurations are possible. For example, as shown in FIGS. 3A and 3B, a membrane-type structure 310 may be used with the probe 320 that is heatable with a heating element 326. Such structures typically include a membrane 312 that is moved relative to a base 314 when a potential is applied between two electrodes 316.

Figure 4:
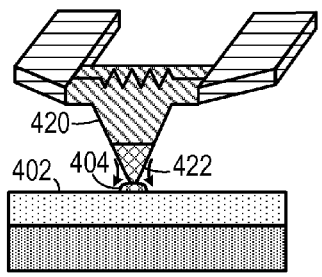
FIG. 4 is a schematic diagram showing nanolithographic deposition using a heated probe affixed to a cantilever.

In certain applications, it is useful to be able both to deposit and to remove material selectively from a surface. In one embodiment, additive patterning is possible by first coating the cantilever with a high melting temperature ink and then holding the tip in contact with a surface. Heating from the cantilever causes the coating to flow from the cantilever tip onto the surface when the cantilever is hotter than the melting temperature of the ink. One mechanism for adding material is shown in FIG. 4, in which a portion of the tip 422 of the probe 420 is coated with a material that exists in a non-flowable state when the material is below a threshold temperature and that exists in a flowable state when the material is above the threshold temperature. The tip 422 is placed adjacent to a preselected location on the substrate 402 and is heated to a temperature that is above the threshold temperature. This causes the material to flow onto the substrate at the preselected location 404. Many materials may be used to coat the tip 422, depending on the desired nature of the resulting surface of the substrate 402.

In one experimental embodiment, additive nanopatterning was shown by patterning submicron squares and sub-100-nm lines of octadecylphosphonic acid (OPA) on a mica surface. This approach can be thought of as thermally-activated dip pen nanolithography (DPN), as it improves upon conventional DPN in that it can be turned on an off with the heating of the cantilever tip. An additional benefit of this method is that there is a wide variety of molecules that may be deposited, including: organics, sol-gels, and metal salts and even high-melting temperature inks such a metal eutectics (as solder) or perylene (which could be used as a molecular electronics component).

The decomposition depth of polymer can be controlled by controlling the heating temperature of the probe tip and the scan speed of the system. By varying the heating temperature and the scan speed when the tip is scanning across an area, a three dimensional structure can be produced. The versatility of this technique can be further improved by using multiple scans in a given area.

Without an applied heating voltage, the cantilever works in a normal contact mode to image the surface. When the heating voltage is turned on, the cantilever can reach thermal equilibrium in a short time, such as within 10 ms. If the probe tip contacts polymer surface physically, the polymer in a very small region around the tip will be heated up almost instantly. When the polymer is heated above its decomposition temperature, the polymer chain is broken down into small molecules. Most of these small molecules are evaporated by the hot probe tip. At the same time, the tip sinks into the polymer film. The depth the tip can sink into the polymer film is determined by how much polymer is decomposed under the hot tip. This is determined by the heating temperature and scan speed. For the un-decomposed polymer, because it is cross-linked, it will not be melted and will thus keep its shape so as to construct a 3D structure. Some minor residue might be left behind around the thermal written area. However, this residue can be removed by washing with a solvent, such as isopropyl alcohol (IPA).

The decomposition depth when a heated tip scans on the polymer surface can be controlled by modulating the combination of the heating temperature and the heating time. Thus, different amounts of polymer at different positions can be removed in a single scan by changing the scan speed and heating temperature. This means a multi-level structure can be made in a single pass. Multiple scans can also be used to remove different amounts of material selectively at different positions to make a three-dimensional structure.

In one experimental embodiment, a heated atomic force microscopy (AFM) probe tip was used to remove polymer material selectively by thermal decomposition. The amount of material removed by a heated probe tip at the selected position was controlled by choosing different combinations of heating temperatures and scan speeds. The un-decomposed material can keep the shape as a three-dimensional structure. In certain configurations, the scan speed can be as fast as 60 µm/sec and the root mean square (RMS) roughness of the sculpted surface can be as low as 1.7 nm. The vertical resolution can be less than 10 nm, and the lateral resolution can be less than 100 nm.

The experimental embodiment used heatable AFM cantilevers that were made of doped single crystal silicon. An electrical resistance heater-thermometer integrated into the silicon cantilever allowed for temperature-controlled heating. The cantilever heating time was <10 µs, at which the cantilever can reach temperature of above 1000° C. In one embodiment, the cantilever had a base electrical resistance of 1.83 KΩ at room temperature, a spring constant of 0.35 N/m, and a tip sharpness estimated at 15 nm. The cantilever temperature was calibrated to within 5° C. using Raman thermometry. The experiment was performed with a commercial AFM system (a PicoPlus system available from Molecular Imaging, 4666 S. Ash Avenue, Tempe, Ariz. 85282) operated in contact mode with a closed loop 3-axis scanner.

Figure 5:
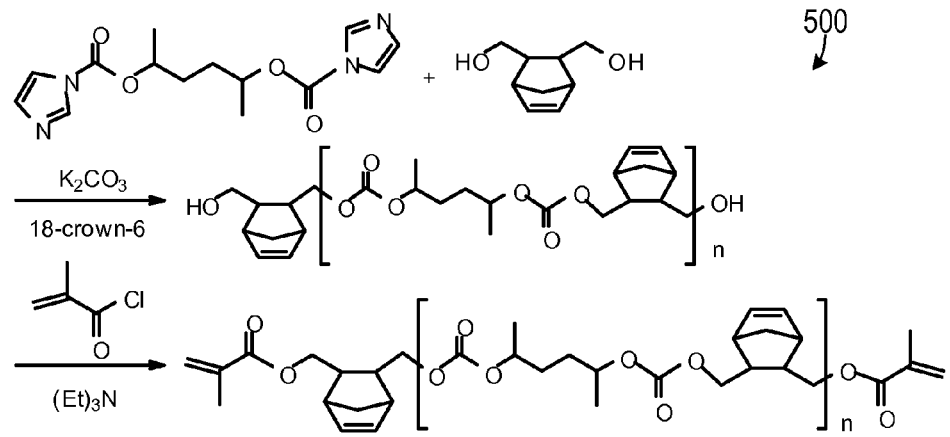
FIG. 5 is a chemical drawing demonstrating a synthetic route for preparation of cross-linkable co-polycarbonates oligomer that may be employed in one embodiment.

The material for the substrate used was a cross-linked polycarbonate film with a thickness of 145 nm. To make the film, a propylene glycol monomethyl ether acetate (PGMEA) solution containing 5 wt % of a cross-linkable polycarbonate oligomer and 5 wt % of AIBN to the solid content was spin coated on a silicon wafer with 160 nm thermally-grown $SiO_2$ layer at the top. The film was cured at 100° C. on a hotplate under $N_2$ for 10 hours to get a uniform and cross-linked polymer film. Preparation of the cross-linkable polycarbonate oligomer 500 is shown in FIG. 5, in which a hydroxyl group terminated oligomer was first synthesized by using a solid-liquid phase-transfer-catalyzed polycondensation of the bis(carbonylimidazolide) of 2,5-hexanediol with 5-norborene-2-exo,3-exo-dimethanol (available from Sigma-Aldrich Corp.). The molecular weight of the oligomer was controlled by controlling the ratio of monomers. The oligomer was end capped with methacryloyl chloride (available from Alfa Aesar). The oligomer used had a number average molecular weight of $M_n$=3,200 g/mol, which was determined by 1H-NMR end group analysis (using a Mercury Vx 400 instrument, available from Varian, Inc.). The cross-linked polymer had a glass transition temperature ($T_g$) of 53° C., and a decomposition temperature of 290° C. with a 50% weight loss.

In thermal writing experiments, before applying the heating voltage, the cantilever was first brought to the polymer surface, and then a scan over the surface was started. The heating voltage was turned on and the tip was heated to a high temperature when it approached the place where the material needed to be removed. The polymer in contact with the heated probe tip was removed by thermal decomposition. The scan speed, in this experiment, could be changed during scanning and could vary from 0.4 µm/sec to 60 µm/sec.

Figures 6A, 6B:
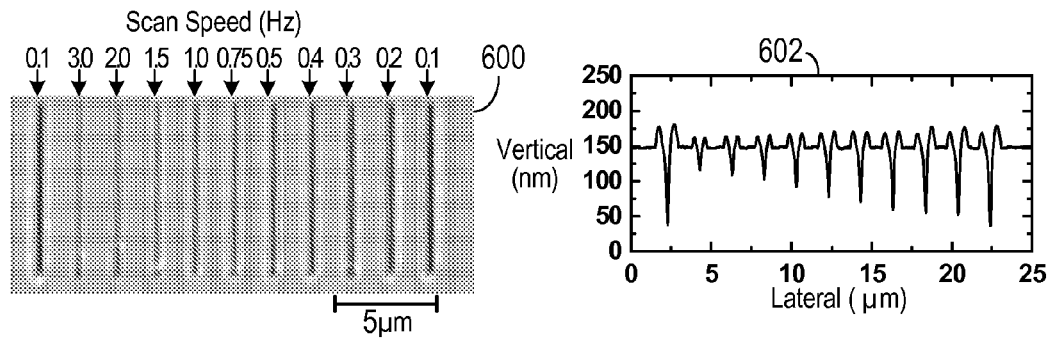
FIG. 6A is a micrograph of several lines formed in a surface at different scan speeds.
FIG. 6B is a graph relating vertical depth to width of a line formed by one experimental embodiment.

An AFM topograph 600 of a set of lines made by thermal writing with a hot probe tip at a constant temperature of 663° C., but different scan speeds, is shown in FIG. 6A. A graphical representation 602 of a cross-section of the lines shown in FIG. 6A is shown in FIG. 6B. The line width at the top is around 100 nm to 200 nm, which depends on the depth of the line. The cross section profiles of the lines show that at a constant heating temperature, the line depth decreases as the scan speed increases. This is because at a higher scan speed, less time is used to scan a single line and, therefore, less polymer can be decomposed at any given point in the scan.

Figure 7:
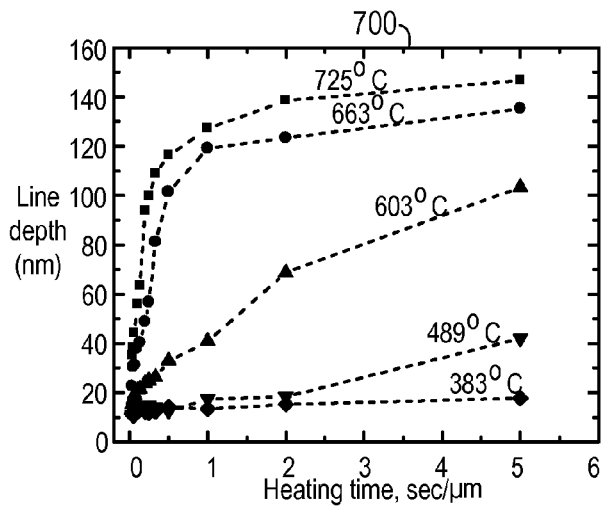
FIGS. 7 is a graph that relates line depth to heating time and probe temperature.

A graph 700 of numerical data, as shown in FIG. 7, gives more detailed information about line depth vs. heating temperature and heating time. The heating time was calculated by dividing the line length by the total time used to thermal write a single line. When the heating temperature was 383° C., the line did not go deeper even with an increase the heating time. This may indicate that although the temperature of the heater on the cantilever was above the decomposition temperature of the polymer, the polymer contacting the probe tip was not heated above the decomposition temperature. This is because there is a temperature drop along the height of the tip. Also there is a temperature drop at the interface between the tip the polymer because of the interface thermal impedance. It is believed that about a 15 nm line depth at this heating temperature was due only to thermal indentation by the hot tip. For temperatures of 489° C. and above, the line depth increased with increased heating time. The higher heating temperatures resulted in steeper initial slopes, which indicate a relatively high decomposition rate. This is because the decomposition rate increases exponentially relative to temperature. However, once the line depth goes above 100 nm, the rate of line depth increase decreases. This could be because the temperature at the tip drops when the tip is buried into the polymer film: when the line goes deeper, there is more contact area between the tip and polymer and heat transported from the heater to the tip can be dissipated easily, resulting in a temperature drop of the tip. Because of the angled shape of the tip, the amount of polymer that is decomposed by the tip is proportional to the square of the line depth. When the line goes deeper, more polymer must be decomposed to achieve the tip depth. However, when this happens the heat conduction rate through the tip can be a limiting factor for the polymer decomposition.

Figures 8A, 8B:
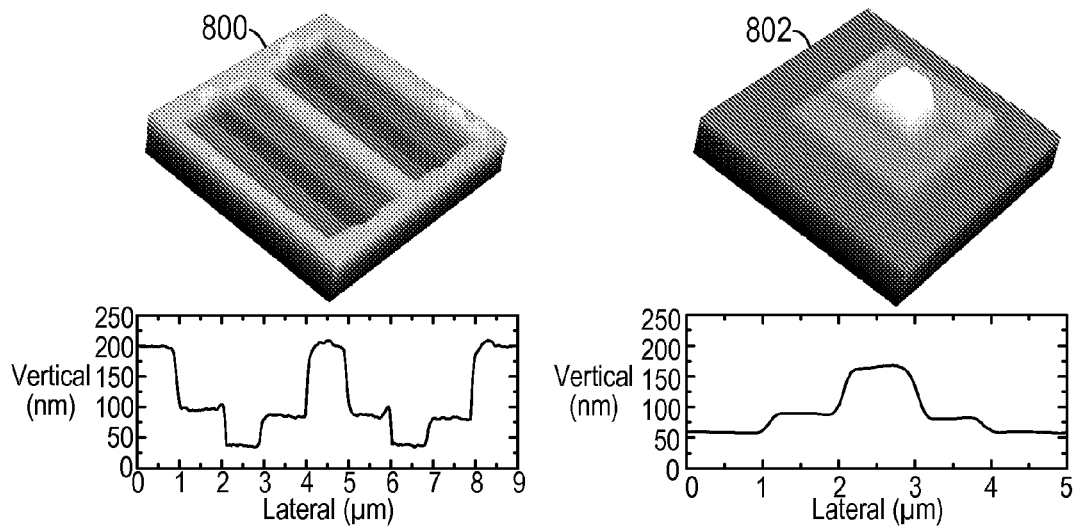
FIGS. 8A-8B are micrographs of sculpted surfaces along with corresponding topographical cross-sections of the surfaces.

Two different three-dimensional structures made using different heating temperature and scan speeds, combined with multiple scans, along with corresponding graphic representations of the structures' cross sections, are shown in FIGS. 8A and 8B. These two structures were imaged after IPA washing to remove the residue and after baking them at 100° C. for 5 minutes to remove the solvent. For the structure 800 having two adjacent inversed pyramid shaped slots, shown in FIG. 8A, the middle level was made by thermal writing at 663° C. with a scan speed of 28 µm/sec, and the bottom level was made by thermal writing at 725° C. with a scan speed of 7 µm/sec. The height of the first step from the bottom is about 50 nm, and the height of the second stop is about 100 nm. The RMS roughness of the middle level surface is only 2.2 nm. The two slots have almost identical cross section profiles, indicating that this nano-scale sculpting technique is highly repeatable. For the pyramid shaped 3D structure 802, shown in FIG. 8B, the middle level was made by thermal writing at 643° C. with a scan speed of 10 µm/sec, and the bottom level was made by thermal writing at 725° C. with a scan speed of 10 µm/sec. In order to make the isolated top square and middle square, both the middle level and the bottom level were made by two separated scans. The RMS roughness of the middle level surface is about 1.7 nm.

Nano-scale three-dimensional structures of this type have the potential to be used as molds to make nano-scale three-dimensional objects, in such applications as imprinting. Also such structures may have applications in supporting layers in the fabrication of other nano-scale devices. In certain applications, the polymer can be thermally decomposed to make buried three-dimensional voids.

Figure 9:
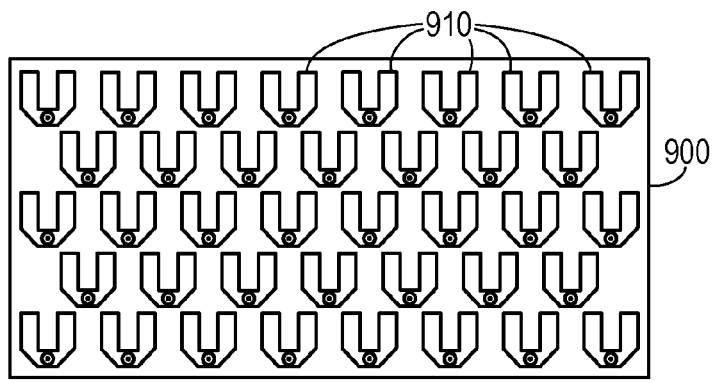
FIG. 9 is an array of cantilevers with probes affixed thereto.

As shown in FIG. 9, the throughput of this 3D nano-sculpting technology can be linearly scaled up by using a cantilever array 900. Such an array 900 could include independently-addressable heating elements that each control the temperature of a different probe tip. It could also employ independently-addressable cantilever actuators so as to allow simultaneous independent depth settings for the probes. Such an embodiment could be used to make such things as masks for integrated circuits having nano-scale feature sizes.

Heated AFM cantilever arrays have already been used for data storage, in which they require short writing times, small written bits, and low writing power. The requirements for a lithography system are similar, although the power requirement could be relaxed, and writing time may be even more important. The cantilever typically has a heating time in the range of 1-10 ps and a cooling time in the range of 1-20 ps. Since the cantilever is typically longer than the heat diffusion length during a typical heating pulse, the cantilever cooling time increases for increasing heating time. The cantilever temperature can approach 550° C. in short pulses and, because the resistive heating element is also a temperature sensor, calibration of the cantilever temperature response is possible to within 1° C. It is also possible to make these cantilevers in large arrays. One experimental study has shown that an array of more than 4000 active cantilevers can be manufactured.

Figure 10:
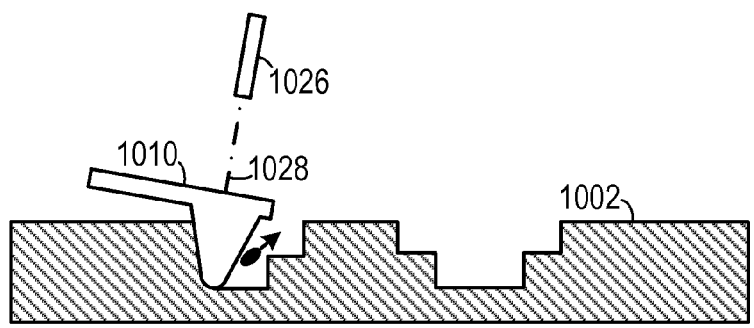
FIG. 10 is a cross-sectional view of an embodiment in which the probe is heated with electromagnetic radiation.

As shown in FIG. 10, the probe 1010 may be heated by a heading element that is disposed away from the probe 1010. For example, an electromagnetic radiation source 1026, such as a laser, can direct a beam 1028 to the probe 1010, thereby heating it. Other types of electromagnetic radiation may be used. For example, a focused microwave beam may be used.

Certain applications, such as integrated circuit applications, might require patterning of insulators on a surface. Two types of insulator materials that could be deposited using the thermal cantilever arrays include (1) organic materials including polymers, oligomers, or waxes and (2) inorganic materials such as metal oxides.

In cases where relatively large amounts of an insulator must be deposited, selective removal of thermally sacrificial polymers would be an effective approach. There are two classes of polymers that can be used as thermally sacrificial materials for such an application. These polymers decompose cleanly into small, benign, volatile byproducts without leaving residue. The first class of materials which can serve this purpose are functionalized polynorbornenes (PNBs). These materials cleanly decompose back into monomer products at temperatures in the range of 425° C., and leave little if any residue. Depending on the detailed structure, PNB polymers can be made such that the polymer glass transition temperature ($T_g$) is either below or above the decomposition temperature ($T_d$) of the polymer. In cases where $T_g$ is greater than $T_d$, the polymer is resistant to flow during thermal processing and in general can be made to decompose without any significant thermal reflow.

PNB materials are a leading candidate to serve as next generation low dielectric constant packaging materials for microelectronics devices and, thus, their physical, chemical, and electrical properties are well suited for microelectronics applications. The second class of polymers which also can be used as thermally sacrificial materials are functionalized polycarbonates (PCs). Depending on the structure of the PC, these materials can be tailored to decompose at temperatures ranging from 80° C. to 300° C. The polycarbonate polymers decompose to yield carbon dioxide and low molecular weight alcohols or other simple volatile organic compounds. The glass transition temperature of these materials can be tailored from below room temperature to nearly the decomposition temperature of the polymer. In addition, some of the polycarbonates form polycrystalline films when deposited, which also aid in resisting thermal can reflow even in low glass transition temperature materials.

A third choice for depositing insulators, which may be particularly useful in applications which require high-dielectric constant materials, is to use thermally sensitive metal-organic precursor films that can be used to directly form metal oxide structures. A series of metal-organic precursor families can be coated from solution to form high quality thin films. These metal-organic precursors have been designed such that they can be converted to metal oxides using either heat or radiation exposure (ultraviolet light, electron beams, etc.). In the simplest process flow, such a precursor can first be coated into a continuous thin film. The thermal cantilevers can then be used to convert the metal-organic film locally into the corresponding metal oxide. After the film is patterned thermally, the remaining unconverted precursor regions can easily be removed by rinsing the film in an appropriate solvent.

Organic conductors and metals are two general types of conductors that can be patterned using this method. There are at least three ways that metals can be patterned using the thermal cantilevers. Metals can first be deposited in a manner analogous to that previously described for depositing metal oxides using metal-organic precursor films. For example, a precursor for copper can be used either to (1) form copper oxide patterns if thermally treated or exposed to radiation in oxygen rich environments or (2) directly form copper metal if converted in a reducing atmosphere such as forming gas. If the copper precursor film is first converted to a patterned copper oxide film, it can also be subsequently converted back into a copper metal pattern by heating the structure in a reducing atmosphere. A second option is first to deposit a metal oxide film that can easily be selectively reduced to metal via local heating in a reducing atmosphere. This is straightforward in the case of the conversion of copper oxide to copper metal, which is a relatively easy reduction to perform under mild conditions. In this case, after the desired metal regions are produced by reduction, undesired copper oxide can either be left in place to serve as an insulator or can be selectively removed using wet etching methods. It is also possible to deposit metal patterns directly using solder materials which can be made to melt and flow at low temperatures as described previously.

In the case of organic conductors one option could be to deposit high quality films of the conductive organic material and then convert the organic material to an insulating form via selective local heating, which could promote either oxidation or thermal rearrangement of the conductor. Certain organic conductors and semiconductors, such as polythiophene, can be locally converted into insulating forms via selective radiation exposure such as using electron beams.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A device for sculpting a substrate, comprising:
   a. a vertically displaceable probe having a nano-scale dimensioned probe tip;
   b. a displacement mechanism configured to adjust a vertical displacement between the probe tip and the substrate; and
   c. a heating mechanism that selectively heats the probe tip to a preselected temperature that is sufficient to cause a portion of the substrate in contact with the probe tip to decompose.

2. The device of claim 1, wherein the displacement mechanism comprises an actuator that is coupled to the probe and that is configured to change a vertical displacement of the probe.

3. The device of claim 1, wherein the displacement mechanism comprises an actuator that is coupled to the substrate and that is configured to change a vertical displacement of the substrate.

4. The device of claim 1, wherein the probe and the displacement mechanism are part of an atomic force microscope.

5. The device of claim 1, further comprising a translator that causes the substrate and the probe tip to move relative to each other in a lateral dimension along a preselected path.

6. The device of claim 1, wherein the heating mechanism includes a heating element that is adjacent to the probe tip.

7. The device of claim 6, wherein the heating element comprises a resistive member that is integrated with the probe.

8. The device of claim 6, wherein the heating element comprises a source of electro-magnetic radiation that is configured to direct electromagnetic radiation to the probe.

9. The device of claim 8, wherein the source of electromagnetic radiation comprises a laser.

10. The device of claim 8, wherein the source of electromagnetic radiation comprises a microwave generator.

11. The device of claim 1, further comprising a micro-cantilever having a distal end to which the probe is affixed.

12. The device of claim 11, wherein the micro-cantilever includes
   a. probe portion, having a first end and an opposite second end, from which the probe depends, the probe portion including a heating element;
   b. a first leg extending from the first end of the probe portion; and
   c. a second leg extending from the second end of the probe portion.

13. The device of claim 12, wherein the first leg and the second leg are both conductive and wherein the heating element comprises a resistive material that generates heat when a potential is applied between the first leg and the second leg.

14. The device of claim 1, wherein the probe is one of a plurality of spaced-apart probes, each probe capable of interacting simultaneously with a different portion of the substrate.

15. A device for sculpting a substrate, comprising:
   a. an array of independently heatable probes, each of the probes including a probe tip;
   b. a heating mechanism capable of heating each probe tip to a temperature that will cause material in the substrate adjacent to the probe tip to decompose; and
   c. a translator that causes the substrate and the array to move relative to each other in a lateral dimension along a preselected path.

16. The device of claim 15, wherein each of the probes is affixed to a distal end of a micro-cantilever and wherein a corresponding plurality of actuators each control an angle of a corresponding micro-cantilever.

17. The device of claim 15, wherein each of the heatable probes includes an independently-addressable heater that controls the temperature of the probe tip.

18. The device of claim 15, wherein each of the heatable probes includes an independently addressable heating element.

19. The device of claim 18, wherein each independently addressable heating element comprises a resistive member.

20. A method of sculpting a substrate with a tip of an integrated heatable probe, comprising the steps of:
   a. changing a displacement of the tip relative to the substrate so that the tip is at a preselected depth in the substrate; and
   b. heating the tip to a temperature that will cause a portion of the substrate in a region adjacent to the tip to decompose.

21. The method of claim 20, further comprising the step of laterally translating the substrate relative to the tip, thereby decomposing the substrate according to a predetermined path.

22. The method of claim 20, further comprising the step of adding a material to the substrate.

23. The method of claim 22, wherein the adding step comprises the steps of:
   a. coating a portion of the tip with a material that exists in a non-flowable state when the material is below a threshold temperature and that exists in a flowable state when the material is above the threshold temperature;
   b. disposing the tip adjacent to a preselected location on the substrate; and
   c. heating the tip to a temperature that is above the threshold temperature, thereby causing the material to flow onto the substrate at the preselected location.

* * * * *